(12) United States Patent
Klosner et al.

(10) Patent No.: US 6,416,908 B1
(45) Date of Patent: Jul. 9, 2002

(54) PROJECTION LITHOGRAPHY ON CURVED SUBSTRATES

(75) Inventors: Marc A. Klosner, White Plains, NY (US); Marc I. Zemel, Bedminster, NJ (US); Kanti Jain, Briarcliff Manor, NY (US); Nestor O. Farmiga, Clifton, NJ (US)

(73) Assignee: Anvik Corporation, Hawthorne, NY (US)

( * ) Notice: Subject to any disclaimer, the term of this patent is extended or adjusted under 35 U.S.C. 154(b) by 124 days.

(21) Appl. No.: 09/606,914

(22) Filed: Jun. 29, 2000

(51) Int. Cl.[7] .................... G03F 9/00; G03B 27/42; G03B 27/58; G03B 27/04; G03B 27/52
(52) U.S. Cl. .................. 430/5; 355/53; 355/55; 355/47; 355/86
(58) Field of Search ............... 430/5, 322; 355/53, 355/55, 47, 86

(56) References Cited

U.S. PATENT DOCUMENTS 5,178,974 A * 1/1993 Hawryluk et al. .............. 430/5
6,304,316 B1 * 10/2001 Jain et al. ..................... 355/53

* cited by examiner

*Primary Examiner*—S. Rosasco
(74) *Attorney, Agent, or Firm*—Carl C. Kling (57) ABSTRACT

A microlithography system, capable of performing high resolution imaging on large-area curved surfaces, based on projection lithography. The system utilizes a high-resolution lens to image a curved mask directly onto a curved substrate. The system uses a curved mask which is identical in shape to the curved substrate, in order to achieve a constant track length for conjugate object and image points, thereby maintaining focus over the full area of curved substrates having height variations that greatly exceed the depth-of-focus of the imaging lens. Magnification errors are controlled by continuous adjustments of the z-position of the projection lens during scanning, with the adjustments depending upon the topography of the curved mask and substrate. By performing the lithography using a step-and-scan seamless-patterning microlithography system, it is possible to pattern over large areas, greater than the field size of the lens. When the mask and substrate are mounted on a common scanning platform, the system operates with an inverted mask. The system also has provisions for making the appropriate curved projection masks, using a planar contact printing technique to pattern high-resolution features on a flexible film which is stretched over a curved mask blank and secured by a frame, with the option of using the system itself to replicate the curved mask onto an indeterminate number of curved fused-silica mask blanks, by projection printing.

22 Claims, 5 Drawing Sheets

PROJECTION LITHOGRAPHY ON CURVED SUBSTRATES

CROSS-REFERENCE TO RELATED APPLICATIONS (Not Applicable).

STATEMENT REGARDING FEDERALLY SPONSORED RESEARCH OR DEVELOPMENT (Not Applicable).

REFERENCE TO A MICROFICHE APPENDIX (Not Applicable).

BACKGROUND OF THE INVENTION

(1) Field of the Invention

This invention relates to projection lithography systems for imaging on curved substrates, and more particularly relates to a large-area lithography system featuring a curved mask that is identical in size and shape to the curved substrate, for the purpose of achieving a constant optical path length for conjugate image points in order to maintain the substrate surface within the depth-of-focus of the projection optics, thereby providing an effective depth-of-focus significantly greater than the depth-of-focus of the projection optics. Additionally, the system has provisions for compensating for magnification errors that arise as a result of imaging a curved mask onto a curved substrate. The system performs patterning on curved surfaces by means of small-field seamless scanning techniques to achieve high resolution over an entire large-area curved substrate. This invention also relates to a technique for fabricating the appropriate curved projection masks, using a planar contact printing technique to replicate a planar pattern onto a flexible film which is stretched over a curved mask blank and secured by a frame, with the option of using the system itself to replicate the original mask onto an indeterminate number of curved fused-silica mask blanks, by projection printing.

(2) Description of Related Art

Although microlithographic patterning has traditionally been performed on planar substrates, primarily for the fabrication of computer chips and microcircuits, there exist many applications which are based on microcircuits or circuit-like elements fabricated on curved surfaces. For example, CCD (charge coupled device) arrays constructed on spherical silicon substrates, rather than flat substrates, could significantly enhance the performance of digital imaging systems. As with any conventional lens system, an increased collection efficiency and larger fields-of-view could be achieved by utilizing a curved image plane, in this case a curved CCD array, matched to the inherent curvature of focus of the optical system (the Petzval curvature). Although the individual pixels for CCD arrays are typically ~25 μm in size, the electrical interconnects are of the order of 1 μm in width. We note that microcircuits having features 1 μm and below generally are fabricated using projection lithography, and thus projection techniques would be useful for patterning curved CCD's. Another area of potential widespread application is in the fabrication of frequency selective surfaces (FSS), which are used as electromagnetic windows usually in the millimeter-wave and microwave portions of the electromagnetic spectrum. FSS consist of a repeating array of identical elements, typically on a flexible dielectric material such as Kapton. The individual elements are often in a tripole or quadrupole configuration, with the sizes of the elements of the same scale as the wavelength of selectivity. In order to optimize the bandwidth and polarization responses of FSS arrays, and to improve the uniformity of the responses with respect to angle of incidence, the FSS elements often are fabricated as closed contours with the contour linewidth measuring a fraction of the design wavelength, of the order of tens or hundreds of microns. Active FSS, which have electronic devices, such as diodes, integrated into their periodic structures, are based on semiconductor device technology and are therefore fabricated using traditional semiconductor-processing materials and techniques. The active elements must be printed with high resolution, of the order of microns in scale. Thus the fabrication of both passive and active FSS requires the use of high-resolution patterning technology, with resolution down to the micron scale for active FSS.

Many techniques have been investigated for patterning high-resolution features on curved surfaces, with a number of methods based on new materials-based processes and applications. For example, there exist a variety of imprinting techniques based on soft-lithography methods, using stamps or molds to replicate patterns on curved surfaces. (Y. Xia and G. Whitesides, *Angew Chem. Int. Ed.*, 37, 550–575, (1998)). A somewhat different fabrication method utilizes conventional photolithography processes, by which a flat substrate is first patterned using planar fabrication techniques; the planar substrate is subsequently mechanically deformed into the desired curved shape, so that after deformation the features reside on a surface having the desired curvature (see, for example, Z. Suo, *Appl. Phy. Lett,* 74, 1177–1179 (1999)). Several variations of the deformation approach have been utilized for FSS fabrication on curved dielectric substrates. For example, planar substrates may be patterned and subsequently deformed into the desired FSS shape either by heat-forming or by assembling patterned strips directly onto the curved substrate. (T. Wu, *Frequency Selective Surface and Grid Array,* John Wiley and Sons, 1995) Contact printing directly onto FSS substrates has also been investigated, using a mask that conforms to the curved substrate. See, for example, U.S. Pat. No. 5,395,718, Jensen et al., CONFORMAL PHOTOLITHOGRAPHIC METHOD AND MASK FOR MANUFACTURING PARTS WITH PATTERNED CURVED SURFACES, Mar. 7, 1995. See also, U.S. Pat. No. 5,552,249, Jensen et al., METHOD FOR MAKING A MASK USEFUL IN THE CONFORMAL PHOTOLITHOGRAPHIC MANUFACTURE OF PATTERNED CURVED SURFACES, Sep. 3, 1996.

As described by Jensen, et al., the curved masks used in this process have been fabricated by laser direct-writing, utilizing a three-axis stage to control the position of the mask during the writing process. Masks fabricated in this manner have been successfully used to pattern images on curved substrates by contact printing. However, as with planar contact printing methods, throughput is limited by the vacuum pulldown time, and cost efficiency is reduced by the need to replace masks, as they are subject to degradation resulting from their intimate contact with the curved substrates.

Other methods for patterning onto curved surfaces, such as direct-writing, could be successfully used, having the substrate situated on an x, y, z-stage, with z-adjustments for maintaining the substrate in the focus of the writing beam. However, direct-writing is slow and would therefore be unsuitable for high-throughput fabrication. For example, for patterning on planar substrates, projection lithography is the preferred method because of the much higher throughputs that can be achieved, compared to direct writing. Although traditional projection lithography techniques using planar masks can be used for very high throughput lithography on planar substrates, there are currently no very high throughput techniques described in the literature for projection imaging onto curved surfaces, even for relatively large features, tens or hundreds of microns in size. This is primarily due to the limited depth-of-focus (DOF) of projection imaging systems. For example, for conventional steppers and scanners achieving a resolution of the order of a micron, the DOF is of the order of 10 microns, which is far too small for imaging a planar mask onto curved CCD or FSS substrates having height variations of typically several centimeters and several tens or hundreds of centimeters, respectively. Even for projection systems having a resolution of only 100 microns, which would be sufficient for certain passive FSS, the DOF would be of the order of only several millimeters, which is not sufficient for imaging a planar mask onto typical FSS structures, which have height variations significantly greater than several millimeters. We note that it would be possible to perform projection imaging onto curved substrates, using planar masks, by modifying conventional steppers or scanning systems such that the z-position of the substrate could be adjusted during patterning to maintain the substrate within the DOF of the imaging system. However, to operate in this mode, it would be necessary to restrict the size of the image field such that the height of the substrate does not vary by more than the DOF of the imaging system, over any substrate region equal in size to the image field. For practical curved-substrate imaging applications, such as CCD fabrication, the maximum-allowable image field would consequently not be much larger than many microns. Using such a technique, throughputs would be higher than for contact printing but significantly lower than for projection printing onto planar substrates. Thus the use of conventional projection lithography systems operating with planar masks would not be suitable for very high throughput lithographic patterning onto curved surfaces such as CCD arrays and FSS. However, it should be noted that a method for achieving improved throughputs by projection printing using planar masks has been described in copending U.S. patent application Ser. No. 09/176,920 now U.S. Pat. No. 6,304,316, MICROLITHOGRAPHY SYSTEM FOR HIGH-RESOLUTION, LARGE-AREA PATTERNING OF CURVED SURFACES, Jain, Farmiga & Dunn, filed Oct. 22, 1998. See also U.S. Pat. No. 5,285,236, LARGE-AREA, HIGH-THROUGHPUT, HIGH-RESOLUTION PROJECTION IMAGING SYSTEM, Jain, Feb. 8, 1994. The copending Jain et al. application describes the Anvik system for seamless hexagonal complementary projection scanning using planar masks, for projection printing onto curved substrates using a deformable mirror in the imaging system to enhance the DOF, and z-actuators to maintain the substrate within the enhanced DOF region. The Anvik system is effective, but its wide range of capability does not always provide the optimum economics in mass production, and there may be limits to the degree of enhanced performance that can be achieved by using the deformable mirror. There remains a need for a more effective, economical system for mass-production projection imaging of microelectronics features on curved substrates.

There are a number of existing techniques for imaging onto a curved surface, in addition to Jensen's method, which was noted earlier. See, for example, U.S. Pat. No. 3,694,080, Malsky, METHOD AND APPARATUS FOR PHOTOPRINTING CONDUCTOR PATTERNS ON THE CURVED SURFACES OF TRANSDUCERS, Sep. 26, 1972, which describes a technique using a cylindrical substrate with the cylinder revolving past a small scanning station for projection patterning via a curved mask, keeping the focus effectively unchanged at the scanning station while the cylinder revolves. Malsky is limited to rotational presentation of the substrate in a step and repeat imaging system.

Another technique, a contact method which permits the curved surface to be a compound curve such as a radome for an aircraft, uses a contact photo mask which is adhered to a metallic layer on the inside of the radome. After exposure, an etching step leaves a pattern in the metallic lawyer. See, for example, U.S. Pat. No. 4,388,388, Kornbau et al, METHOD OF FORMING METALLIC PATTERNS ON CURVED SURFACES, Jun. 14, 1983. See also U.S. Pat. No. 5,344,729, Akins et al, CONFORMAL PHOTOMASK FOR THREE-DIMENSIONAL PRINTED CIRCUIT BOARD TECHNOLOGY, Sep. 6, 1994.

The prior art suffers from the problems of contact printing, including wear and damage due to contact, or does not have the resolution required for present-day needs. There is a continuing need for high-resolution non-contact projection imaging for patterning intricate details on curved surfaces.

BRIEF SUMMARY OF THE INVENTION

This invention provides to a large-area lithography system the capability of patterning onto a curved substrate, using a curved mask in order to achieve a fixed track length for conjugate object and image points, thereby maintaining the curved substrate surface within the depth-of-focus (DOF) of the projection optics; this invention also provides the capability for controlling magnification errors arising as a result of the curved patterning technique. This invention provides these capabilities while retaining the option of small-field seamless scanning techniques to achieve high resolution over the entire large-area curved substrate.

The object of the invention is to make possible a high-resolution projection imaging operation on a curved substrate with height variations significantly greater than the depth-of-focus of the imaging optics.

Another object of the invention is to permit scanning projection imaging, by minimizing and compensating for destructive magnification error.

A feature of the invention is a curved mask having a curvature that is identical to, i.e., having the same size and shape, as the curved substrate.

Another feature of the invention is the inverted orientation of the curved substrate with respect to the curved mask when the mask and substrate are mounted on a common scanning platform, thus keeping the track length constant for conjugate image points, with motion provided to the projection lens to compensate for magnification error.

An advantage of the invention is that it makes it possible to perform high-resolution projection imaging on curved surfaces having topography variations greater than the depth-of-focus of the imaging system.

Other objects, features and advantages of the invention will be apparent to those skilled in the art, in view of the drawings and written description.

DETAILED DESCRIPTION OF THE INVENTION

Figure 1:
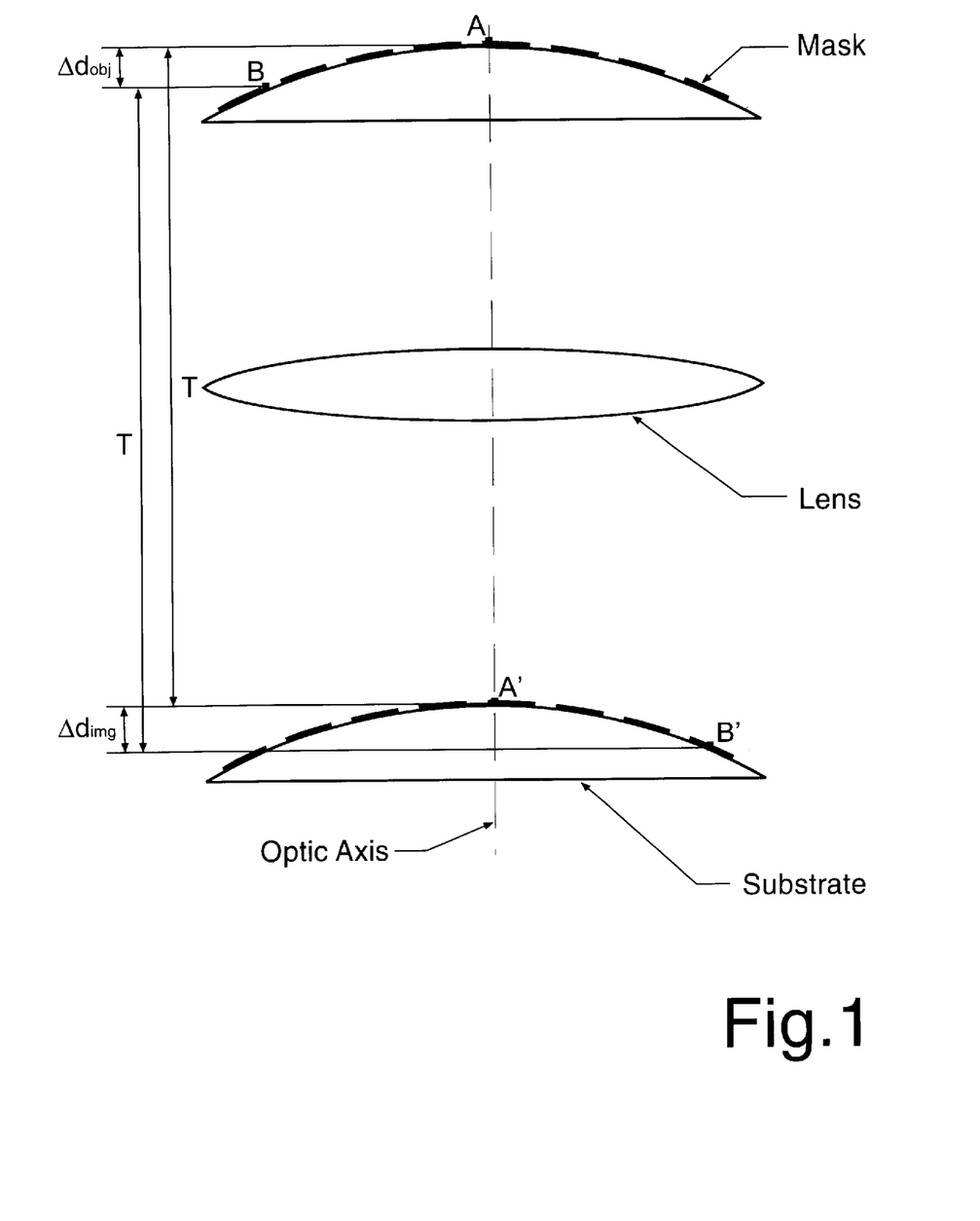
FIG. 1 is a simplified semidiagrammatic elevation view of a preferred embodiment of the invention, showing curved mask and curved substrate and unchanging optical path length T in an in-line projection embodiment.

FIG. 1 shows the preferred embodiment for patterning onto curved substrates by using a mask having a curvature that is identical to that of the substrate (i.e., the size and shape of the mask and substrate are the same) and by additionally performing the imaging using a 1:1 projection imaging system. As we describe, the effective depth-of-focus is greatly increased beyond the actual depth-of-focus of the imaging system, using this configuration. Additionally, by performing the imaging using a seamless scanning projection lithography system which utilizes a moving lens to control magnification errors, we are able to achieve patterning throughputs comparable to those which can be achieved for patterning onto planar substrates.

FIG. 1 illustrates the principle of patterning onto a curved substrate using an identically-curved mask and a 1:1 projection imaging system. Note that with this configuration, the track length, T—which is defined as the distance from the plane perpendicular to the optic axis, in which a point on the curved mask is situated, to the plane in which its conjugate point on the curved substrate is situated—is identical for all conjugate points. By having a constant track length and a 1:1 imaging system, all points on the mask are imaged, in focus, on the substrate, as we describe.

First consider the lens equation, $1/d_{obj} + 1/d_{img} = 1/f$, where $d_{obj}$ and $d_{img}$ represent the distances from the principal planes to the object and image planes, respectively, and f is the focal length of the imaging lens. With this equation, it can be shown that a shift in the object plane along the z-axis (which is coincident with the optic axis) by an amount $\Delta d_{obj}$ causes a shift $\Delta d_{img}$ in the conjugate image plane by an amount $\Delta d_{img} = -m^2 * \Delta d_{obj}$, to first order, where m is the magnification of the imaging system, defined by the ratio $d_{img}:d_{obj}$. Thus for a 1:1 imaging system for which magnification is precisely unity (i.e., $d_{img} = d_{obj}$ and m=1), $\Delta d_{img} = -\Delta d_{obj}$. That is, for a 1:1 system, a shift in the position of the object plane results in an identical shift in the position of the image plane. Thus referring to FIG. 1, assume that the vertices A and A', on the mask and substrate, respectively, satisfy the lens equation such that magnification for these conjugate points is precisely unity. For point B on the mask, the object plane is shifted by an amount $\Delta d_{obj}$ from the vertex, as shown in the figure. Therefore, the conjugate image plane for B' shifts by $\Delta d_{img} = -\Delta d_{obj}$, to first order. With this first order consideration, the image is precisely in focus on the curved substrate, since the curvature of the substrate is identical to that of the mask. Note that when higher order terms (referred to as h.o.t.'s) are included in the determination of $\Delta d_{img}$, it is evident that in actuality, $\Delta d_{img}$ deviates slightly from $\Delta d_{obj}$, i.e., $\Delta d_{img} = -\Delta d_{obj} + $h.o.t.'s, and therefore that the conjugate image point does not fall precisely on the identically curved substrate. However, the image on the substrate will remain in focus so long as the total magnitude of the h.o.t.'s is less than or equal to the depth of focus of the imaging system.

With the curved-mask/curved-substrate patterning technique, it is also necessary to consider the deviations, from unity, in magnification that occur for conjugate image points, depending upon their z-position on the substrate. We refer to these deviations as magnification errors, since they differ from the ideal magnification of unity. These errors are detrimental because they cause imaged features to be offset from their desired position on the substrate.

We note that for any lens, there can be only one pair of conjugate planes for which magnification is precisely unity. For the patterning technique described herein, it follows, since the substrate and mask are curved (and, consequently there exists a continuum of conjugate planes within a given image field) that magnification must differ from unity for all but a single pair of conjugate planes. Therefore, magnification errors are unavoidable. For example, we assume that as shown in FIG. 1, vertex A' is the conjugate point of A, with unity magnification, i.e. $d_{img} = d_{obj}$, and for simplicity we assume that the principal planes of the lens are half-way between A and A'. Therefore, for any other point on the mask, such as B, $d_{obj}$ decreases (relative to $d_{obj}$ for point A) since it is closer to the principal plane compared to point A; for its conjugate image point, B', on the substrate, $d_{img}$ increases, governed by $\Delta d_{img} = -\Delta d_{obj}$. Consequently, the magnification ratio, $d_{img}:d_{obj}$, for B and B' is greater than 1. We emphasize that so long as the shifts, $\Delta d_{img}$ and $\Delta d_{obj}$, are sufficiently small, magnification deviates only slightly from unity. For example, for a typical high-resolution lithography lens, a shift in the object by 1 mm, results in a change in the magnification by only approximately 100 parts in 1,000,000. For stepper systems, where the entire mask pattern is imaged in a single exposure, the magnification error would be constant for any feature at a given point within the image field, and therefore the resulting feature offsets can be compensated for in the mask design by taking into account the offsets incurred due to imaging. However, for scanning systems, for which the features are imaged by a multitude of overlapping exposures, the magnification errors would be non-constant, differing for each exposure, since any single feature is exposed at different points within the image field as the mask and substrate are scanning. This results in non-constant feature placement errors, with the offset for a particular feature varying as the feature is scanned through the field of the imaging lens, and the greatest offsets occurring when the feature is at the edge of the field. Since, for any given feature, the errors change during scanning, the errors cannot be compensated for in the mask design.

Thus we emphasize that for imaging systems such as steppers, which perform exposures on stationary substrates, the curved-mask/curved-substrate patterning technique can be used to perform high resolution microlithography so long as the magnification errors that occur are compensated for in the mask design, if they would otherwise be unacceptably large. However, we note that to maintain focus over the entire image field it would also be necessary that the contributions to $\Delta d_{img}$ from h.o.t.'s are less than or equal to the DOF of the projection lens over the field, in order to maintain a sharp image on the substrate. These h.o.t. contributions would depend upon the particular lens design and the maximum variation in height over the region of the substrate within the image field. Thus the size of the image field can be large, limited only by the condition that, within the field, h.o.t. contributions are less than the DOF.

For scanning systems, magnification errors must be compensated for in the overall system design rather than in the mask design, as we describe in detail in the following section.

Patterning Onto Curved Surfaces Using an Anvik Seamless Scanning System

Figure 2:
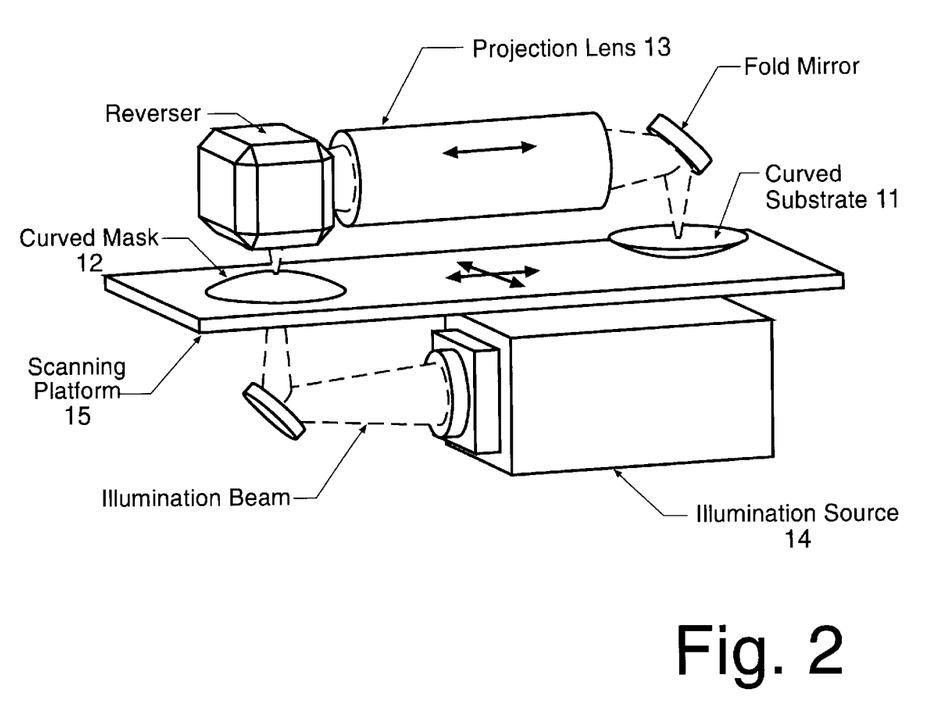
FIG. 2 is an elevation view of the preferred embodiment, with an inversely-oriented curved mask and a curved substrate on a common scanning platform.

FIG. 2 illustrates the configuration of the curved mask and curved substrate when lithography is performed utilizing an Anvik large-area seamless scanning microlithography system, as described in U.S. Pat. No. 5,285,236, issued Feb. 8, 1994. The Anvik system uses a hexagonal image field to achieve seamless scanning, and a reverser unit which maintains the required image orientation on the substrate. Elements of greatest significance in FIG. 2 are: curved substrate 11; curved mask 12; projection lens 13; illumination source 14 and scanning platform 15. The curved substrate 11 and curved mask 12 are situated on a common scanning platform 15, simplifying the overall system design. We note that since this is a seamless scanning system, the mask can be significantly larger than the image field. When the Anvik system is configured, using this invention, for patterning a curved mask onto a curved substrate, the mask and substrate sit on the single scanning platform, with the mask oriented in an inverted manner with respect to the substrate. With this configuration, a constant track length is maintained from any object point on the mask to its conjugate image point on the substrate. Note that the illustration shown in FIG. 1 is simply an optically-unfolded representation of the configuration of the mask and substrate as they are positioned on the Anvik system. (The effects of the reverser are not represented in the unfolded FIG. 1).

Figure 3:
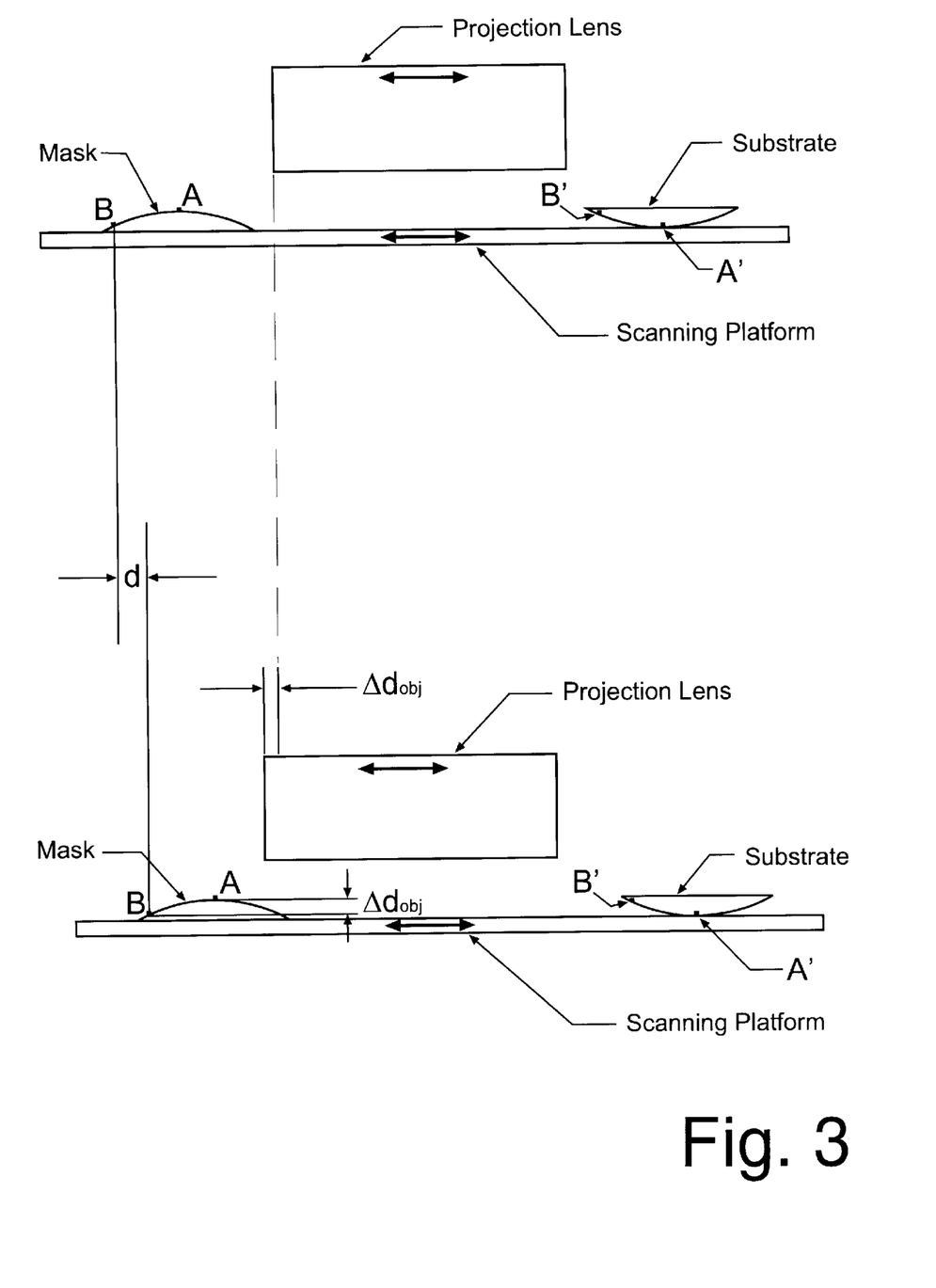
FIG. 3 is a discussion diagram showing the positional adjustment of the lens that is required for controlling magnification errors.

As noted previously, for systems performing scanning exposures, magnification error leads to feature placement errors which cannot be corrected by means of an error-compensating mask design. In order to limit these placement errors to acceptable levels for Anvik's high resolution 1:1 imaging systems, the magnification error must typically be less than approximately 20 ppm, i.e., the magnification should not deviate from unity by more than 20 parts per million. We note that for a typical high-resolution lens, the magnification would change by approximately 20 ppm for a 200 µm shift (i.e., 100 ppm for a 1 millimeter shift, as mentioned earlier) in the object and conjugate image planes. Therefore, when performing lithography using a lens having this particular magnification error specification, so long as the total height deviation over the mask and identically-matched substrate is less than 200 µm, it would be possible to perform scanning exposures without any magnification-correction mechanism since magnification errors greater than 20 ppm would not occur at any point within the image field, over the entire substrate. However, for masks and substrates having height variations exceeding 200 µm, magnification error must be actively corrected during patterning. The Anvik system performs this correction by means of continuous adjustments of the position of the lens as the mask and substrate are scanning, maintaining unity magnification at the central point of the image field. Specifically, the lens position is controlled such that for any shift, $\Delta d_{obj}$, in the z-position of the central point as the mask and substrate are scanning, there is an equivalent shift in the position of the lens, by amount $\Delta d_{obj}$, as shown in FIG. 3. For example, as shown in the figure, assume the system is initially configured to image vertex A onto A', at the center of the field, and that $d_{obj}=d_{img}$, i.e., m is unity for those conjugate points. As the mask and substrate are scanned, B moves into the center of the image field. Since the z-position of B differs from that of A by an amount $\Delta d_{obj}$, the lens shifts by $\Delta d_{obj}$ to maintain unity magnification for point B and its conjugate point B' when B is at the center of the field. We emphasize that the lens must be adjusted in this manner for the entire continuum of points on the mask which pass through the center of the field as the stage is scanning. It should be noted that, alternatively, magnification error could be compensated for by moving both the mask and substrate by equal distances in the z-direction, adjusting their positions by an amount $\Delta d_{obj}$ for shifts, $\Delta d_{obj}$, in the z-position of the object point at the center of the field. Thus, for a continuously curved mask and substrate, i.e., without any planar regions, the projection lens is constantly in motion as the stage scans. With either of these methods for error compensation, there are no theoretical limits to the size of the substrate which can be patterned, nor are there limits to the total deviation in the substrate height. However, the field size would be limited, depending upon the topography of the substrate, such that magnification variations within the image field are less than 20 ppm. For substrates having only either convex or concave curvatures, the greatest magnification error within any image field would occur at a point along the edge of the field, since the largest $\Delta d_{obj}$ (measured with respect to the field center) must occur for some point at the periphery of the field. It follows that larger field sizes could be achieved by using substrates having smaller curvatures. Additionally, larger field sizes could also be achieved by using a lens for which the changes in magnification, i.e. magnification errors, are less sensitive to $\Delta d_{obj}$, the deviations in the object position.

Figure 4:
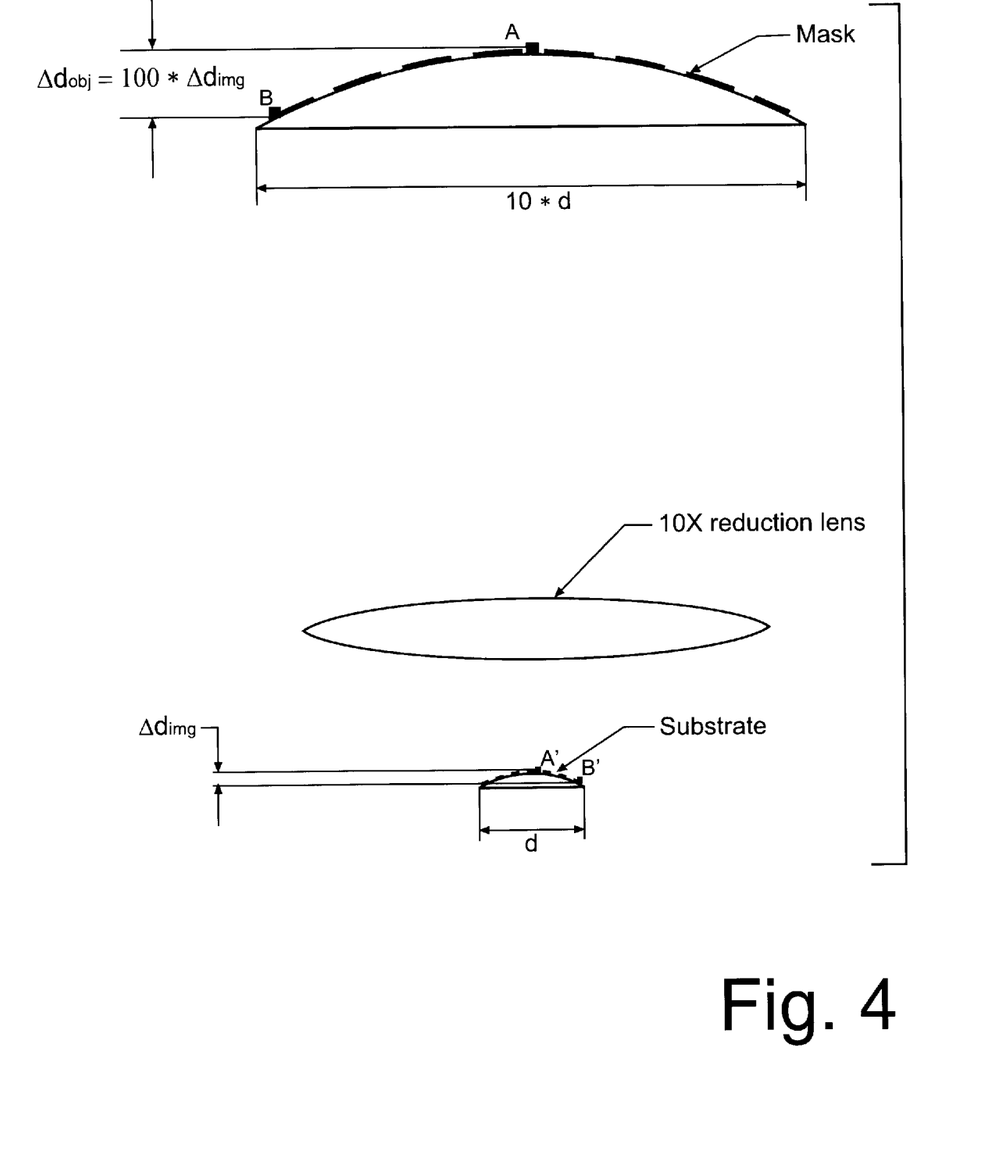
FIG. 4 is a discussion diagram showing 10× reduction imaging of a curved mask onto a curved substrate.

We note that the fundamental principle of operation, i.e., a curved mask matched to the curved substrate, is not restricted to practical applications only for imaging systems operating with 1:1 magnification. The same principle could be applied to patterning onto curved substrates using either magnifying or reduction imaging systems, so long as the curvature of the mask is related to the curvature of the substrate by the formula $\Delta d_{img}=-m^2 * \Delta d_{obj}$. For example, for a 10× reduction system used for patterning onto a curved substrate, the mask should be designed, as shown in FIG. 4. For the system shown in the figure, assume point A on the vertex of the mask is imaged with precisely 10× reduction as point A' on the vertex of the substrate. To achieve an in-focus image of point B' on the mask, lying in an image plane shifted in the z-direction by $\Delta d_{img}$ with respect to A', the mask should be designed such that the conjugate point B on the mask is situated in an object plane shifted by $\Delta d_{obj}=-100*\Delta d_{img}$, with respect to point A. Note that for a 1:1 imaging system, application of this same principle suggests that the mask should have a curvature identical to that of the substrate, i.e., $\Delta d_{obj}=-1*\Delta d_{img}$ as has been described in the previous discussions regarding 1:1 imaging systems.

Mask Fabrication

For initial system development, we have investigated the imaging of features onto spherical substrates. For our mask and substrate materials, we have chosen optical-grade fused silica having a spherical curvature. Fused silica has been selected because it is suitable for operation at ultraviolet wavelengths and also because it has excellent dimensional stability. Additionally, the spherical fused silica elements can be fabricated with extremely high precision, having deviations from their design shapes of less than 1 µm. Since these deviations are significantly less than the DOF of a typical high resolution imaging system (for which DOF is generally greater than several microns), a pair of elements serving as mask and substrate, and designed to have identical curvature, would meet the tolerance requirements for this curved patterning system.

Figure 5:
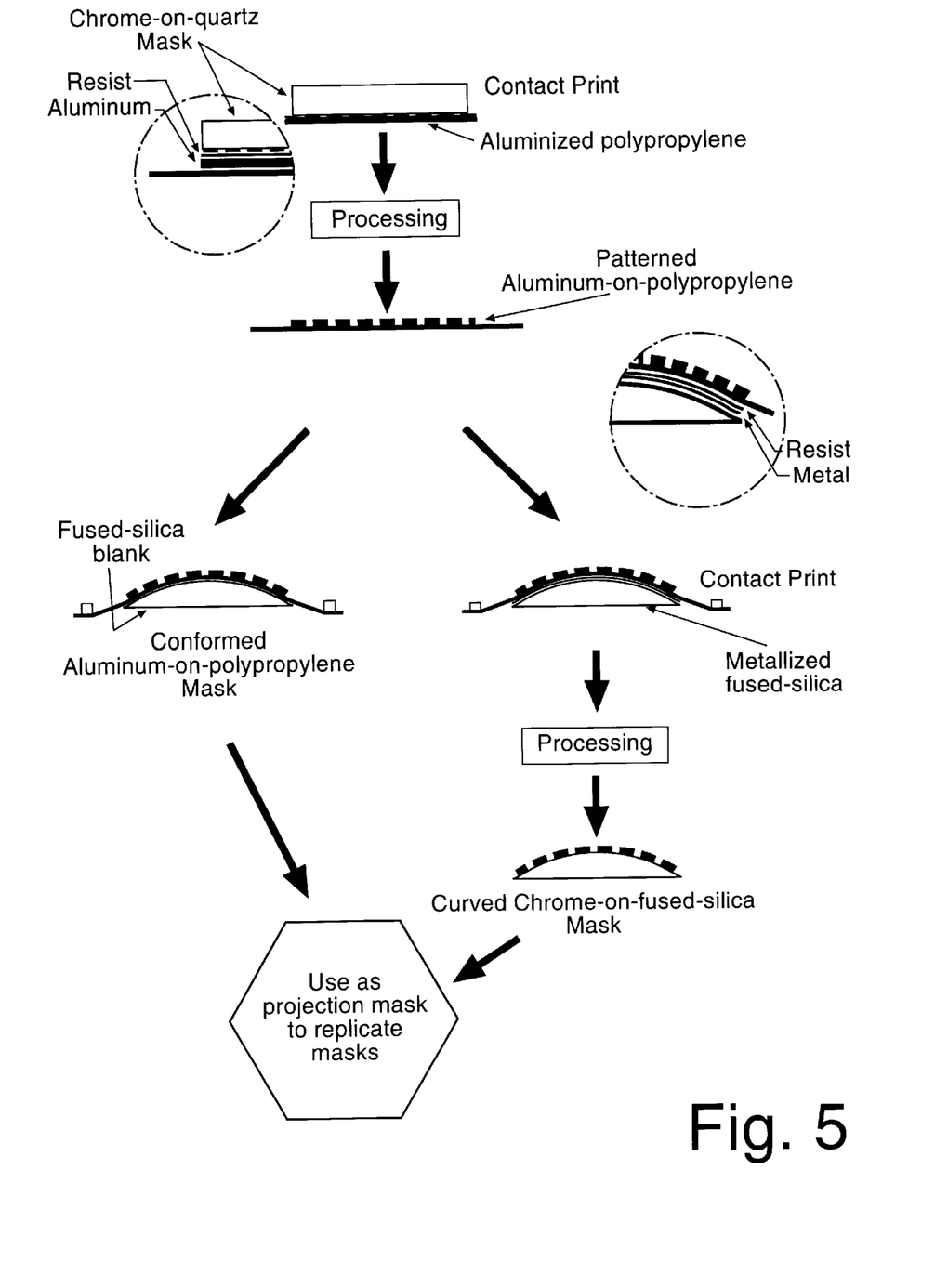
FIG. 5 is a diagram for fabricating curved masks.

Due to the limitations of commercially available photoplotters and electron beam mask writers, which are capable of patterning only onto essentially planar substrates, there does not currently exist a technology base for fabricating curved masks that are suitable for use with this invention. We have therefore developed a process for fabricating curved masks, as illustrated in FIG. 5. As shown in the figure, initially, the pattern from a planar mask, such as a chrome-on-quartz mask, is reproduced by contact printing onto a resist-coated metallized polymer membrane, for example 5μm-thick polypropylene coated with several-hundred angstroms of aluminum. The polypropylene membrane is then stretched over the fused silica mask blank, maintaining flush contact over the entire area of the blank, as shown in FIG. 5. The stretched membrane is secured by a frame to fix its position. Since the frame maintains the membrane in a state of tension, the position of the membrane mask is extremely stable, with the membrane returning to its original position after any minute perturbations. The polypropylene stretched over the fused silica blank thus serves as a curved mask having high dimensional stability. [Note: Masks described as "quartz" are generally man-made fused silica.]

As an alternative, the aluminum-on-polypropylene membrane mask may be used to fabricate a curved chrome-on-silica mask by means of a contact-printing replication process. To fabricate the chrome-on-silica curved mask, the aluminum-on-polypropylene mask is stretched over a resist coated metallized curved mask blank, and the polypropylene mask pattern is imaged onto the resist-coated blank by means of contact printing. The resist, which is exposed by the contact printing, is developed and the underlying chrome is selectively etched away, thereby reproducing the high resolution pattern on the curved fused silica blank, which thereafter serves as the curved mask. Additional copies of the mask can be fabricated by performing projection printing onto resist-coated metallized blanks using the invention, as described herein, for patterning onto curved surfaces.

We note that the membrane mask used in this process is not necessarily required to be fabricated from the aluminum-on-polypropylene material. Other polymers or alternative materials would be suitable, so long as they can be fabricated in thin conformable sheets of uniform thickness, and are also transparent to the wavelengths that are used in the various imaging steps. Furthermore, metals other than aluminum would be suitable so long as they can be coated onto the conformable mask material. Additionally, the metal should not be susceptible to damage by the illumination source used in the curved mask fabrication process, as well as the source used in the curved lithography application.

What is claimed is:

1. A projection lithography system for imaging a microelectronics pattern onto a curved substrate with provisions for keeping the track length unchanged, thereby maintaining the substrate surface within the depth of focus of the projection optics, while using overlapping complementary seamless scanning techniques, characterized by:
   a) a curved substrate (11);
   b) a curved mask (12), having a well-defined size and shape relationship with respect to said curved substrate (11);
   c) radiation means (14):
   d) projection means (13);
   e) scanning means (15), to present, for scanning, both said curved mask (12) and said curved substrate (11) for imaging by patterned radiation to transfer a pattern image from mask (12) to substrate (11) via said projection means (13);
   whereby the curved mask pattern is imaged onto the curved substrate surface, and the substrate surface remains within the depth-of-focus of said projection means.

2. A projection lithography system according to claim 1, wherein said curved mask (12) is transmissive.

3. A projection lithography system according to claim 1, wherein said curved mask (12) is reflective.

4. A projection lithography system according to claim 1, wherein said curved mask (12) is identical in size and shape to said curved substrate (11) and said track length remains constant.

5. A projection lithography system according to claim 1, wherein said curved mask (12) is identical in size and shape to said curved substrate (11), further characterized by:
   (f) means to control magnification error by providing motion to said projection means or, as an alternative, to provide opposite motions to said mask and said substrate, along the optic axis of said lens, to correct for magnification errors by maintaining distances from object and conjugate image points to principal planes of said lens.

6. A projection lithography system according to claim 5, in which a separate stage for said projection means provides motion.

7. A projection lithography system according to claim 5, in which separate, oppositely-directed stages for said mask and for said substrate provide motion.

8. A projection lithography system for imaging a microelectronics pattern onto a curved substrate with provisions for minimizing magnification error by maintaining a fixed magnification at the center of the lens field characterized by:
   a) a curved substrate (11);
   b) a curved mask (12), whose size and curvature are related to the size and curvature of the curved substrate (11);
   c) radiation means (14):
   d) projection means (13) having magnification or reduction; and
   e) scanning means, to present, for scanning, both said curved mask (12) and said curved substrate (11) for imaging mask to substrate via said projection means (13), with means to move said projection means;
   whereby the curved mask pattern is imaged onto the curved substrate surface, and the substrate surface remains within the depth-of-focus of said projection means.

9. A projection lithography system according to claim 8, in which said projection means comprises a projection lens and means to move the projection lens along the optic axis for magnification error compensation during scanning of said curved mask and curved substrate.

10. A projection lithography stepper for imaging a microelectronics pattern from a curved mask onto a curved substrate, in order to keep the optical path length unchanged, thereby maintaining the substrate surface within the depth of focus of the projection optics, characterized by:
   a) a curved substrate (11);
   b) a curved mask (12) having a well-defined size and shape relationship with respect to said curved substrate, and configured with an inverted orientation with respect to said curved substrate, and patterned with distortion to compensate for magnification error throughout the entire image field;
   c) radiation means (14):
   d) projection means (13);
   e) imaging means (15), to present both said curved mask (12) and said curved substrate (11) for imaging by patterned radiation to transfer a pattern image from curved mask (12) to said curved substrate (11) via said projection means (13);

whereby the track length remains constant so that the substrate surface remains within the depth-of-focus, and the effect of predictable magnification error can be compensated by the design of the mask.

11. A projection lithography system according to claim 10, for imaging a curved mask onto a curved substrate in order to a achieve a fixed optical path length for conjugate image points, thereby maintaining the curved substrate surface within the depth of focus of the projection optics, in which magnification errors are compensated for in the mask design and the size of the image field is selected such that and h.o.t.'s are less than or equal to the DOF for all points within the image field, in which said curved substrate (11) and said curved mask (12) have a mathematically defined relationship determined by the system magnification.

12. A projection lithography system for imaging a curved mask onto a curved substrate, thereby maintaining the image within the depth of focus of the projection optics, using scanning techniques, characterized by:
   a) a curved substrate (11) mounted on a scanning platform;
   b) a curved transmissive mask (12), having an inverted orientation with respect to said curved substrate (11), mounted on said scanning platform;
   c) radiation means (14):
   d) projection means (13);
   e) scanning means (15), to present, for scanning, both said curved mask (12) and said curved substrate (11) for imaging by patterned radiation to transfer a pattern image from curved mask (12) to curved substrate (11) via said projection means (13); and
   f) means to minimize the effects of magnification error by relocating said projection means along its optic axis as a function of current scan position on said curved mask and said curved substrate.

13. A projection lithography system for imaging a curved mask onto a curved substrate, thereby maintaining the substrate within the depth of focus of the projection optics, using scanning techniques, characterized by:
   means to control magnification error, which must be minimized for scanning systems, by continuous adjustment of the position of the projection lens during scanning, with the adjustments being a function of the topography of the curved mask and curved substrate.

14. A curved mask (12) for a projection lithography system, for use in imaging a pattern from its surface to the surface of a curved substrate of known curvature characterized by:
   a) a fused-silica mask body having surface curvature identical to said known curvature of the substrate, having a photo-opaque pattern layer on said surface.

15. A projection lithography mask according to claim 14 wherein said photo-opaque pattern layer on said curved mask (12) is of aluminum.

16. A projection lithography mask according to claim 14, wherein said photo-opaque pattern layer on said curved mask (12) is of chrome.

17. A projection lithography mask made by the following contact lithography/contact lithography process, starting with a planar mask of metal-on-quartz;
   1) Place a layer of photo-active material on aluminized polypropylene in contact with said planar mask;
   2) Expose to imaging radiation;
   3) Process to provide a pattern of aluminum on a flexible film of polypropylene;
   4) Place the patterned aluminum-on-polypropylene in contact with a hard, curved fused-silica blank projection mask.

18. A projection lithography mask made by the process of claim 17, wherein the hard, curved fused-silica blank of step 4 is precoated with a metallized layer and a photoactive resist layer, to serve as an intermediate, and steps are added as follows:
   5) Expose for imaging defined by the pattern;
   6) Process to develop the pattern as a metal-on-quartz curved mask; and
   7) Replicate by projection printing using said metal-on-quartz curved projection mask to fabricate a metal-on-quartz curved projection mask.

19. A projection lithography mask made by the process of claim 18, wherein:
   said metallized layer of said metal-on-quartz curved contact-mask is chrome.

20. A projection lithography scanning system for imaging a curved mask onto a curved substrate, with provisions for magnification error control, which must be minimized for scanning systems, by continuously adjusting the position of the projection lens along its axis during scanning, with the adjustments related to changes of topography of the curved mask and substrate, such that the object distance and image distance for the conjugate points at the center of the lens field remain constant during scanning.

21. A projection lithography system for imaging a curved mask onto a curved substrate with provisions for controlling the magnification error of the projection optics, using scanning techniques with a small image field, in which a 1:1 projection lens is used to maintain focus over the entire image field known to be subject to magnification errors which depend upon the field size, the particular lens design, and the maximum variation in substrate height over the region of the substrate within the image field, characterized in that:
   said projection lens is designed to have a depth of field over the entire image field greater than or equal to the calculated contributions to $\Delta d_{img}$ from h.o.t.'s,
   whereby out-of-focus anomalies and magnification error are minimized.

22. A projection lithography system according to claim 21, further characterized by means to move said projection lens along its optic axis.

* * * * *